(12) United States Patent
Kim

(10) Patent No.: US 7,704,834 B2
(45) Date of Patent: Apr. 27, 2010

(54) METHOD FOR FORMING SPLIT GATE FLASH NONVOLATILE MEMORY DEVICES

(75) Inventor: Heong Jin Kim, Chilgok-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 786 days.

(21) Appl. No.: 11/320,605

(22) Filed: Dec. 30, 2005

(65) Prior Publication Data

US 2006/0148177 A1    Jul. 6, 2006

(30) Foreign Application Priority Data

Dec. 31, 2004  (KR) ...................... 10-2004-0118298

(51) Int. Cl.
*H01L 21/336*   (2006.01)

(52) U.S. Cl. .............................. 438/259; 257/E21.692; 438/267; 438/270

(58) Field of Classification Search ................ 438/593, 438/589, 267, 257, 265, 266, 270, 259; 257/E21.693, 257/E21.209, E29.305, E21.682, E21.692, 257/E21.609, E21.179, E21.68, E21.681
See application file for complete search history.

(56) References Cited

U.S. PATENT DOCUMENTS

| | | | |
|---|---|---|---|
| 5,327,374 A * | 7/1994 | Krautschneider et al. | ... 365/149 |
| 5,495,441 A * | 2/1996 | Hong | .................... 365/185.01 |
| 5,616,510 A * | 4/1997 | Wong | ......................... 438/259 |
| 6,232,632 B1 * | 5/2001 | Liu | ............................. 257/315 |
| 6,262,917 B1 * | 7/2001 | Lee | ....................... 365/185.33 |
| 6,423,589 B2 * | 7/2002 | Park et al. | .................... 438/231 |
| 6,815,758 B1 * | 11/2004 | Chang et al. | ................ 257/315 |
| 7,297,595 B2 * | 11/2007 | Jung et al. | ................... 438/259 |
| 7,417,278 B2 * | 8/2008 | Hsieh et al. | ................. 257/315 |
| 7,491,999 B2 * | 2/2009 | Harari et al. | ................ 257/315 |
| 7,563,673 B2 * | 7/2009 | Kim et al. | .................... 438/257 |
| 2002/0045304 A1 * | 4/2002 | Lee | ............................. 438/201 |
| 2002/0094641 A1 * | 7/2002 | Shin et al. | .................... 438/257 |
| 2003/0178668 A1 * | 9/2003 | Kianian et al. | .............. 257/314 |

(Continued)

*Primary Examiner*—W. David Coleman
*Assistant Examiner*—Latanya Crawford
(74) *Attorney, Agent, or Firm*—Sherr & Vaughn, PLLC

(57) ABSTRACT

Disclosed is a method for forming a non-volatile memory device, comprising the steps of: successively depositing a gate oxide and a floating gate material on a semiconductor substrate; depositing and selectively etching a first dielectric on the floating gate material to form a first dielectric pattern; forming a first floating gate oxide on the floating gate material; selectively etching the floating gate material with using the first dielectric pattern as a mask to form a floating gate pattern; forming an insulating layer on the floating gate pattern; etching a portion of the semiconductor substrate between neighboring floating gate patterns to form a trench in the substrate; depositing a control gate oxide on surfaces of the trench; depositing a control gate material to fill the trench and to cover the substrate surface; depositing a second dielectric on the control gate material; selectively etching the second dielectric and the control gate material to form a control gate pattern and a second dielectric layer; selectively removing the control gate pattern to form a source line pattern which extends from the substrate surface exposed in the trench to top surface of the second dielectric layer on the control gate pattern; forming an insulating layer on surface of the source line pattern; and forming source region in portion of the substrate, which is exposed by the source line pattern.

7 Claims, 4 Drawing Sheets

U.S. PATENT DOCUMENTS

| | | | |
|---|---|---|---|
| 2003/0227048 A1* | 12/2003 | Kianian | 257/314 |
| 2004/0000688 A1* | 1/2004 | Harari et al. | 257/315 |
| 2004/0014284 A1* | 1/2004 | Kim et al. | 438/257 |
| 2004/0018687 A1* | 1/2004 | Hsieh et al. | 438/266 |
| 2004/0183124 A1* | 9/2004 | Hsu et al. | 257/316 |
| 2005/0020012 A1* | 1/2005 | Lee | 438/259 |
| 2006/0146640 A1* | 7/2006 | Kim | 365/232 |
| 2006/0148177 A1* | 7/2006 | Kim | 438/267 |

\* cited by examiner

METHOD FOR FORMING SPLIT GATE FLASH NONVOLATILE MEMORY DEVICES

CROSS-REFERENCE TO RELATED APPLICATION

This application claims priority to and the benefit of Korean Patent Application No. 10-2004-0118298 filed in the Korean Intellectual Property Office on Dec. 31, 2004, the entire contents of which are incorporated herein by reference.

BACKGROUND OF THE INVENTION

1. Field of the Invention

The present invention relates to non-volatile memory technologies, and more specifically, to a method for fabricating electrically erasable programmable read only memories (EEPROM) having split gate memory cells.

2. Description of the Related Art

Flash memory, which is capable of retaining the stored data without continued supply of electrical power, has a stacked gate structure of a floating gate and a control gate. The floating gate, which is placed between the control gate and the semiconductor substrate, is isolated by an insulating oxide layer. When electrons are on the floating gate, they modify the electric field coming from the control gate, which modifies the threshold voltage of the cell. Thus, when the flash memory cell is "read" by applying a specific voltage to the control gate, electrical current will either flow or not flow, depending on the threshold voltage of the cell, which is controlled by the electrons on the floating gate. The presence or absence of current is sensed and translated into 1's and 0's, reproducing the stored data.

The flash EEPROM cells can be classified, according to their gate structure, into: stack gate cells and split gate cells.

FIG. 1A is a cross-sectional view of conventional stack gate flash EEPROM cell, and FIG. 1B is a cross-sectional view of the conventional split gate flash EEPROM cell.

Referring to FIGS. 1A and 1B, the flash memory cell of either stack gate or split gate comprises tunnel oxide 2, floating gate 3, interlayer dielectric 4, control gate 5, drain and source regions 6 and 7 formed in and on a P-type semiconductor substrate 1. The split gate flash memory cell has additional select gate oxide 8 as shown in FIG. 1B.

The stack gate cell of FIG. 1A occupies small area because of its three-dimensional stacked structure but has problems with over-erase when the cell is in an erase operation. The split gate cell of FIG. 1B can avoid the over-erase problem but occupies a larger area, which fails to meet the high integration trend of semiconductor microcircuit devices.

Moreover, the conventional horizonal control gate has a channel length that is formed by overlay control in photolithographic process, and hence variations in threshold voltage or current are observed when driving the control gate. Further, the control gate is formed in parallel to the surface of substrate or wafer, which requires consideration of the overlay margin mentioned above.

SUMMARY OF THE INVENTION

Principles of the present invention, as embodied and broadly described herein, are directed to a method for forming a non-volatile memory device, comprising the steps of: successively depositing a gate oxide and a floating gate material on a semiconductor substrate; depositing and selectively etching a first dielectric on the floating gate material to form a first dielectric pattern; forming a first floating gate oxide on the floating gate material; selectively etching the floating gate material while using the first dielectric pattern as a mask to form a floating gate pattern; forming an insulating layer on the floating gate pattern; etching a portion of the semiconductor substrate between two neighboring floating gate patterns to form a trench in the substrate; depositing a control gate oxide on surfaces of the trench; depositing a control gate material to fill the trench and to cover the substrate surface; depositing a second dielectric on the control gate material; selectively etching the second dielectric and the control gate material to form a control gate pattern and a second dielectric layer; selectively removing the control gate pattern to form a source line pattern which extends from the substrate surface exposed in the trench to top surface of the second dielectric layer on the control gate pattern; forming an insulating layer on surface of the source line pattern; and forming source region in portion of the substrate, which is exposed by the source line pattern.

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

FIGS. 2A to 2F are cross-sectional views illustrating methods for fabricating a flash EEPROM memory cell having a split gate structure according to an embodiment of the present invention.

Figure 1A:
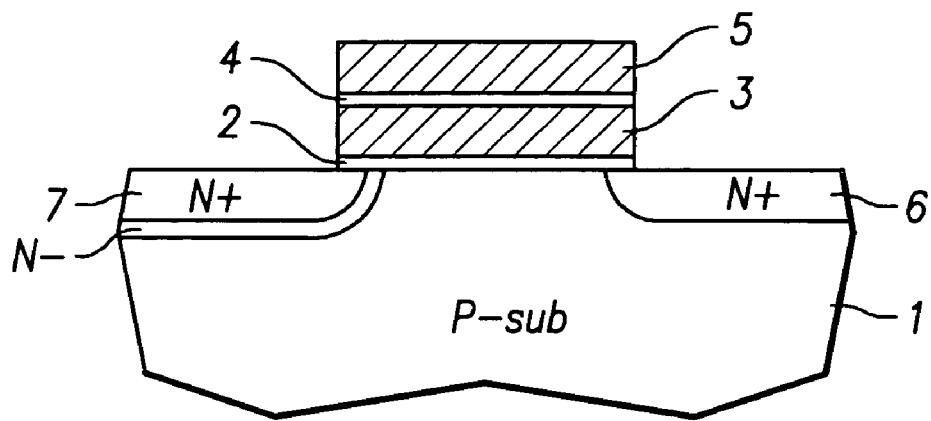
FIG. 1A is a cross-sectional view of conventional flash EEPROM memory cell having stack gate structure.
Figure 1B:
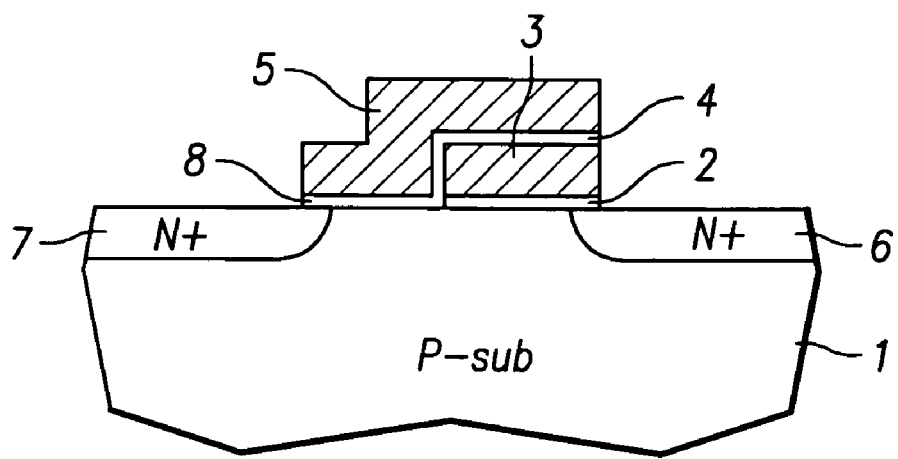
FIG. 1B is a cross-sectional view of conventional flash EEPROM memory cell having split gate structure.
Figure 2A:
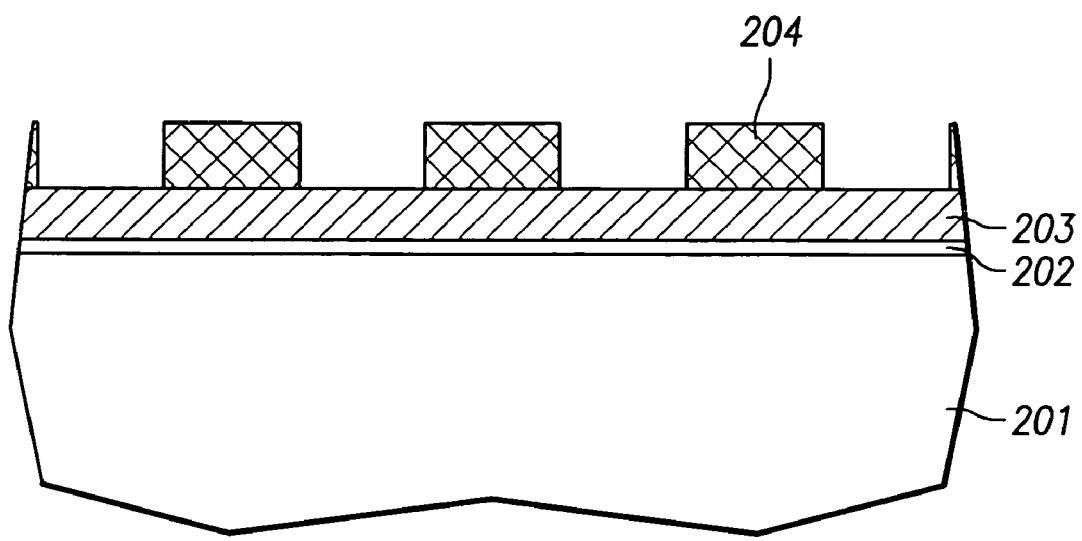
FIGS. 2A to 2F are cross-sectional views illustrating methods for fabricating a flash EEPROM memory cell having new split gate structure according to the present invention.

Referring to FIG. 2A, gate oxide 202 and floating gate material 203 are sequentially deposited on a semiconductor substrate 201. The semiconductor substrate 201, made of silicon, has active regions where circuit elements including the flash memory cells are to be formed and isolation regions which electrically separate the active regions. The isolation regions (not shown) may be formed by shallow trench isolation (STI) or local oxidation of silicon (LOCOS). Further, ion implantation for controlling threshold voltage is carried out to the active regions in the substrate.

First dielectric is deposited on the floating gate 203 and selectively etched by a first photolithographic process to form a first dielectric pattern 204 as shown in FIG. 2A. In an embodiment of the present invention, additional ion implantation is performed to the floating gate 203, which is made of e.g., polycrystalline silicon, after the formation of the first dielectric pattern 204.

Figure 2B:
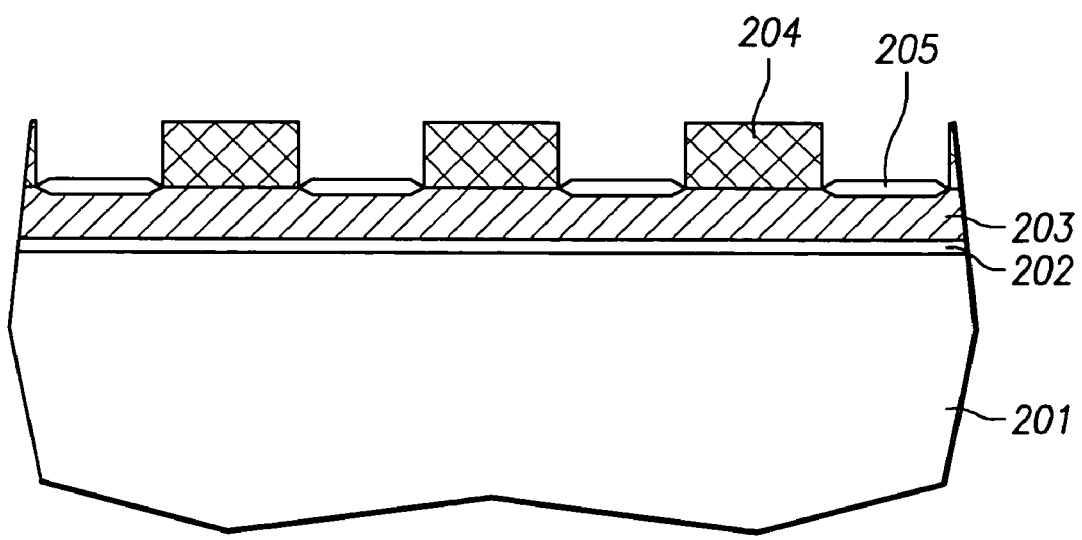

Referring to FIG. 2B, portions of the floating gate 203 exposed by the first dielectric pattern 204 are oxidized by e.g., thermal oxidation to form the first floating gate oxide 205.

Figure 2C:
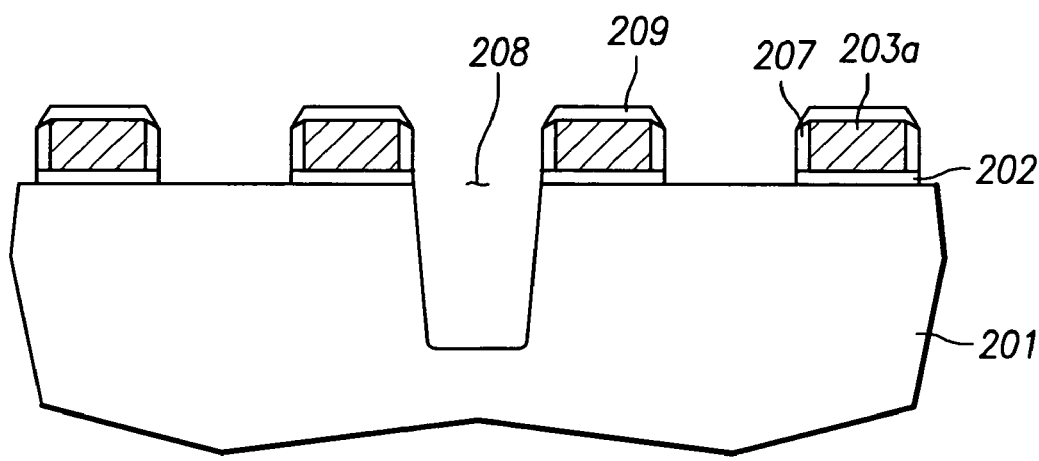

Referring to FIG. 2C, the first dielectric pattern 204 is removed from the substrate surface, and the deposited floating gate material 203 is selectively etched using the first dielectric pattern 204 as a mask to form a floating gate pattern 203a. Subsequently, the floating gate pattern 203a is oxidized to form the second floating gate oxide, which is then anisotropically etched to form sidewall spacers 207 at side surfaces of the floating gate pattern 203a. Then, insulating layer 209 such as oxide is formed on the floating gate pattern 203a.

In subsequent second photolithographic step, the substrate 201 is etched to form the trench 208 and ion implantation for control gate threshold voltage is performed to the bottom surface of the trench 208. In the second photolithographic step, the floating gate is covered and protected by photoresist (not shown) for the second photolithographic step, sidewall spacers 207, and the insulating layer 209, and therefore it is not damaged during this step.

Figure 2D:
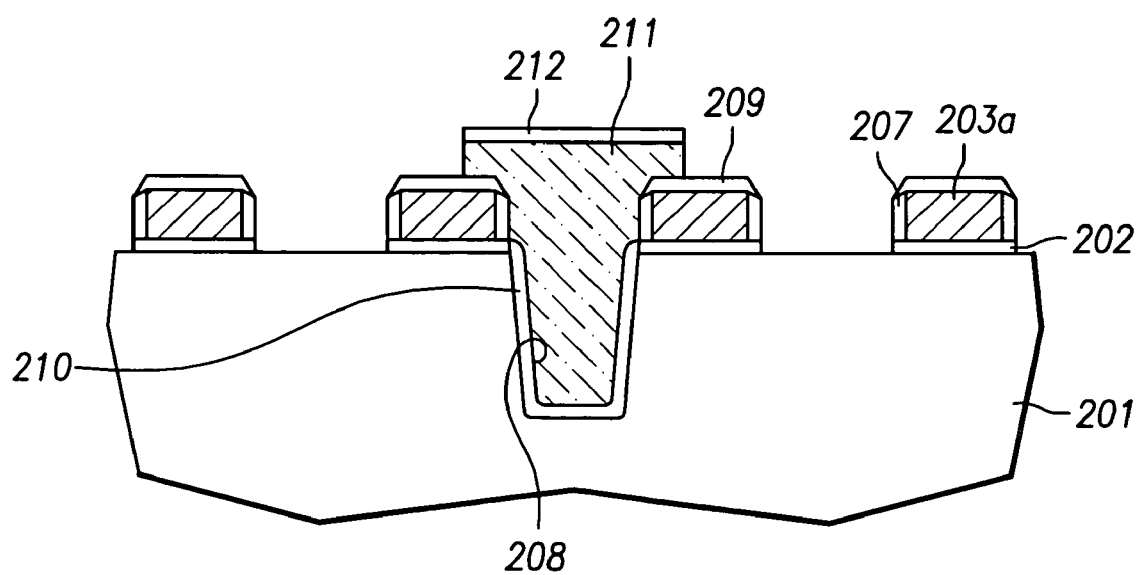

Referring to FIG. 2D, the control gate oxide 210 is deposited on the surface of the trench 208, and the control gate material (e.g., polysilicon) is deposited to fill the trench and cover the entire substrate surface. Like the floating gate material, the control gate material is a doped polysilicon. Then, the second dielectric is deposited on the control gate material. In third photolithographic process, the second dielectric and the control gate material are selectively etched to form the control gate pattern 211 and second dielectric layer 212.

Figure 2E:
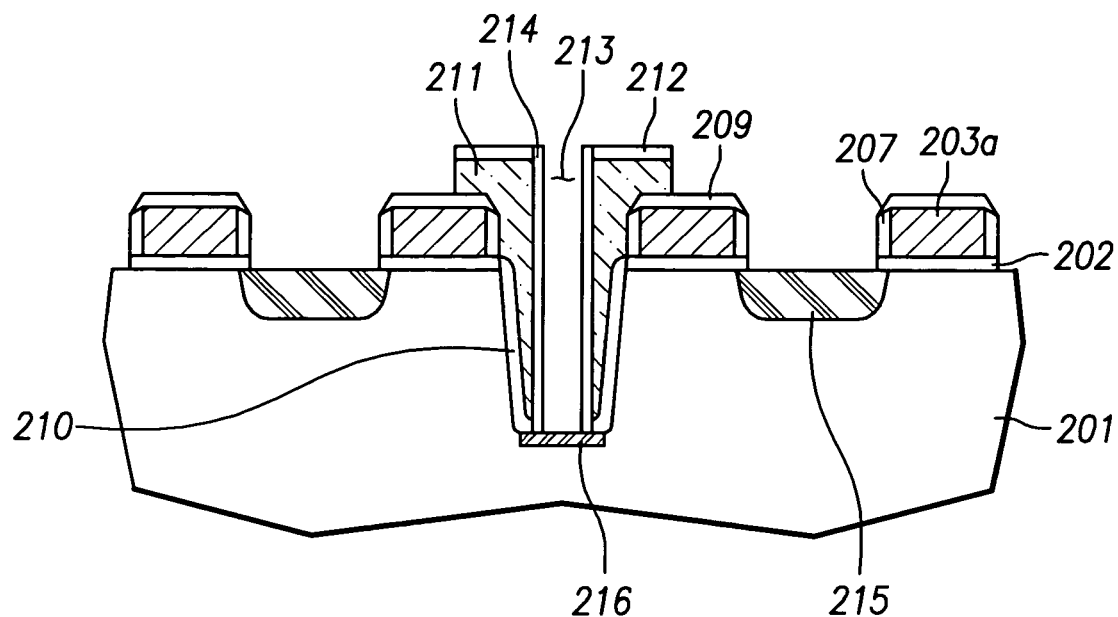

Referring to FIG. 2E, the control gate pattern 211 is selectively removed by fourth photolithographic process to form the source line pattern 213 and then the insulating layer 214 is formed on the source line pattern 213. The insulating layer 214 may be formed by depositing silicon oxide on the surface of the source line pattern and etching-back the deposited silicon oxide. The source line pattern 213 extends from the substrate surface exposed in the trench 208 to the top surface of the second dielectric layer 212 on the control gate pattern 211. Further, the source line pattern 213 is electrically insulated from the control gate pattern 211 by the control gate oxide 210.

Subsequently, portions of the gate oxide 202 between the floating gate patterns 203a are removed, and drain region 215 is formed through the removed portions of the gate oxide 202 by e.g., ion implantation technique. The source region 216 is formed by implanting dopant ions or atoms into the substrate region exposed by the source line pattern 213. In an embodiment of the present invention, the drain and source regions 215 and 216 have different dopant profile and concentrations.

In an embodiment of the present invention, reactive ion etching (RIE) is employed in the third and fourth photolithographic processes, and the insulating layer 214 is formed by oxidation of the control gate pattern 211. Furthermore, in the formation of the sidewall spacers 207 and dielectric patterns, the RIE can be used.

Figure 2F:
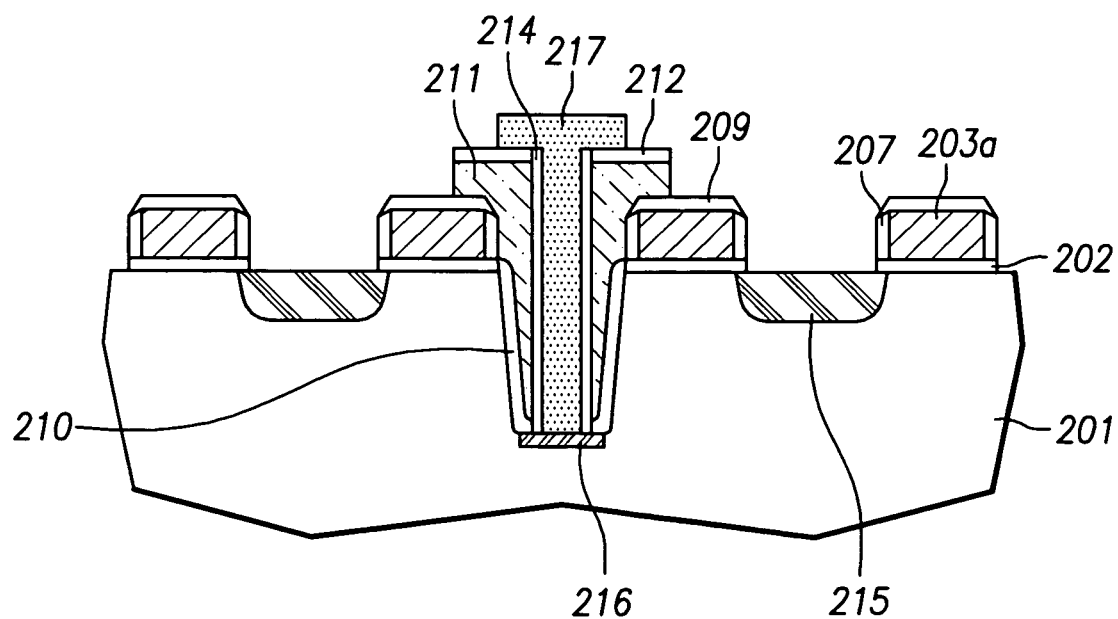

Referring to FIG. 2F, the source and drain metals 217 are formed by fifth photolithographic process. The source and drain metals 217 include aluminum formed by evaporation or sputtering techniques.

The flash EEPROM memory cell of the present invention has a split gate structure and the control gate of the memory cell is formed in a vertical trench, which results in the reduction of the area occupied by the cell in substrate. Further, the channel is self-aligned with the trench and thus the length of the control gate is determined by the depth of the trench. Consequently, the conventional problems due to the misalignment of photolithographic steps can be prevented. Moreover, contact resistance can be decreased because the source junctions of memory cells are contacted to thicker metal electrode, and voids that may be produced in forming pre-metal dielectric (PMD) films are prevented because the source electrode has a step structure.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method comprising:
    forming a plurality of floating gate patterns and floating gate oxide patterns spaced apart on a semiconductor substrate;
    forming a trench in the semiconductor substrate in the space between the floating gate patterns;
    forming a control gate pattern in the trench by depositing a control gate material in the trench and then performing a first etching process on the control gate material such that after the first etching process the control gate pattern comprises a first control gate pattern portion extending parallel to the sidewalls of the floating gate patterns and a second control gate pattern portion extending perpendicular to the sidewalls of the floating gate patterns and over the floating gate patterns;
    forming a dielectric layer pattern on the control gate pattern after forming the trench;
    simultaneously forming a pair of second control gate patterns and a second trench between the second control gate patterns by performing a second etching process on the control gate pattern to expose a portion of the semiconductor substrate in the trench, wherein the dielectric layer pattern is formed before simultaneously forming the pair of second control gate patterns and the second trench;
    forming a first oxide layer on a respective sidewall of the second control gate patterns provided in the trench;
    forming a source region in the exposed portion of the semiconductor substrate in the second trench; and then
    forming a metal layer filling the second trench and on a portion of the uppermost surface of the second control gate patterns.

2. The method of claim 1, further comprising, after forming the plurality of floating gate patterns and floating gate oxide patterns and before forming the trench:
    forming a second oxide layer on the floating gate patterns by performing an oxidation process on the floating gate patterns;
    forming spacers composed of the second oxide layer on sidewalls of the floating gate patterns;
    forming a third oxide layer on the uppermost surface of the floating gate patterns.

3. The method of claim 1, further comprising, after forming the trench and before forming the control gate pattern:
    forming a fourth oxide layer on the uppermost surface of the trench.

4. The method of claim 1, wherein the metal layer comprises aluminum.

5. The method of claim 1, wherein electrically insulating the source line pattern comprises:
    forming the first oxide layer by performing an oxidation process on the second control gate patterns.

6. A method comprising:
    forming a plurality of floating gate patterns spaced apart on a semiconductor substrate;
    forming a plurality of oxide layer patterns covering the upper, bottom and side walls of the floating gate patterns;
    forming a trench in the semiconductor substrate in the space between an adjacent pair of the floating gate patterns;
    forming a control gate pattern by depositing a control gate material in the trench and then performing a first etching process on the control gate material such that after the first etching process the control gate pattern includes a first control gate pattern portion formed in the trench between the adjacent pair of floating gate patterns and a second control gate pattern portion connected to the first control gate pattern and over the floating gate patterns and also over and contacting the oxide layer patterns formed on the upper walls of the adjacent floating gate patterns;

forming a pair of second control gate patterns spaced apart by performing a second etching process on the control gate pattern to expose a portion of the semiconductor substrate at the trench;

forming a source region in the exposed portion of the semiconductor substrate; and then forming a source electrode in the space between the second control gate patterns, the source electrode including a first source electrode portion extending parallel to the sidewalls of the second control gate patterns and a second source electrode portion extending parallel to and over the upper surface of second control gate patterns.

7. A method comprising:

forming a plurality of floating gate patterns on a semiconductor substrate;

forming a plurality of oxide layer patterns covering the floating gate patterns;

forming a trench in the semiconductor substrate in a space between an adjacent pair of the floating gate patterns;

depositing a control gate material in the trench and over the semiconductor substrate;

forming a control gate pattern by performing a first etching process on the control gate material such that after the first etching process the control gate pattern includes a first control gate pattern portion formed in the trench and a second control gate pattern portion connected to the first control gate pattern, wherein the second control gate pattern has an uppermost surface that lies in a plane above the uppermost surface of the oxide layer patterns and the floating gate patterns;

forming a pair of second control gate patterns spaced apart by performing a second etching process on the control gate pattern to expose a portion of the semiconductor substrate at the trench;

forming a source region in the exposed portion of the semiconductor substrate; and then forming a source electrode in the space between the second control gate patterns.

\* \* \* \* \*